US012785304B2

(12) United States Patent
Scott et al.

(10) Patent No.: US 12,785,304 B2
(45) Date of Patent: Nov. 3, 2026

(54) COMPENSATING SET SCREW FOR TERMINAL BLOCKS TO COMPENSATE FOR SETTLING OF MULTI-STRAND WIRE

(71) Applicant: HEWLETT PACKARD ENTERPRISE DEVELOPMENT LP, Spring, TX (US)

(72) Inventors: Michael Dustin Scott, Chippewa Falls, WI (US); Robbie J. Rongstad, Osseo, WI (US); Robert Eugene Mascia, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 458 days.

(21) Appl. No.: 18/591,230

(22) Filed: Feb. 29, 2024

(65) Prior Publication Data

US 2025/0279597 A1 Sep. 4, 2025

(51) Int. Cl.
*H01R 9/24* (2006.01)
*H05K 7/14* (2006.01)

(52) U.S. Cl.
CPC ......... *H01R 9/2416* (2013.01); *H05K 7/1492* (2013.01)

(58) Field of Classification Search
CPC ............................ H01R 9/2416; H05K 7/1492
USPC ............................................................ 439/709
See application file for complete search history.

(56) References Cited

U.S. PATENT DOCUMENTS 6,976,857 B1 * 12/2005 Shukla ................. H01R 9/2483 439/100
7,166,001 B2 * 1/2007 Detter .................. H01R 11/283 439/762
7,537,494 B1 * 5/2009 Umlauf .................... H01R 4/36 439/798
7,645,173 B2 * 1/2010 Larkin ..................... H01R 4/46 174/94 S
7,922,546 B1 * 4/2011 Smith ...................... H01R 4/36 439/792
7,938,663 B2 * 5/2011 Leipold .................. H01R 24/40 439/322

(Continued)

OTHER PUBLICATIONS

Amazon, "M5 Spring Hex Socket Ball Point Grub Set Screws Stainless Steel 20pcs (M5 × 12mm)", available online at <https://www.amazon.com/Spring-Socket-Point-Screws-Stainless/dp/B074K81N8X?th=1>, 1996-2025, 5 pages.

(Continued)

*Primary Examiner* — Harshad C Patel
(74) *Attorney, Agent, or Firm* — Jones Burke, PLLC

(57) ABSTRACT

A computing system includes one or more terminal blocks for terminating power wires, which may be used for delivering power to or distributing power within the computing system. A set screw is provided for each terminal block, with the set screw configured to hold a wire in the terminal block. At least one of the set screws is a compensating set screw. The compensating set screw has a set screw head, a set screw stem, a plunger movable along the stem, a spring mechanism between the head and the plunger, and a retainer to retain the plunger on the stem. The spring mechanism may push the plunger toward the wire, causing the plunger to follow the wire and maintaining pressure between the plunger and the power wire even as the power wire settles over time.

20 Claims, 8 Drawing Sheets

(56) References Cited

U.S. PATENT DOCUMENTS

| | | | | |
|---|---|---|---|---|
| 7,938,679 | B2 * | 5/2011 | Wadsworth ............ | H01R 13/74 439/574 |
| 7,942,692 | B2 * | 5/2011 | Bodenmeier .......... | H01H 89/06 439/511 |
| 9,929,477 | B2 | 3/2018 | Beiler et al. | |
| 10,090,653 | B2 * | 10/2018 | Gibson ................ | H02G 15/043 |
| 10,122,096 | B2 * | 11/2018 | Ruland .................... | H01R 4/36 |
| 10,317,430 | B2 * | 6/2019 | Nagata ............... | H01R 12/7005 |
| 10,446,953 | B1 * | 10/2019 | Raby ........................ | H01R 4/38 |
| 10,823,221 | B2 * | 11/2020 | Wiley .................... | H01B 5/002 |
| 10,965,043 | B2 * | 3/2021 | Lefavour .............. | F16B 35/005 |
| 11,011,896 | B2 * | 5/2021 | Gibson ................ | H02G 3/0625 |
| 11,189,945 | B2 * | 11/2021 | Koshiishi ............. | H01R 12/718 |
| 11,462,847 | B2 * | 10/2022 | Koellmann ............ | H01R 13/11 |
| 12,471,221 | B2 * | 11/2025 | Lott ....................... | H05K 3/303 |
| 12,555,961 | B2 * | 2/2026 | Tezuka ..................... | G10H 3/18 |

OTHER PUBLICATIONS

Weidmuller, "Terminal blocks with spring-loaded connection", available online at <https://web.archive.org/web/20240202064019/https://www.weidmueller.com/int/products/connectivity/terminal_blocks/terminal_blocks_with_spring_loaded_connection.jsp>, Feb. 2, 2024, 3 pages.

* cited by examiner

FIG. 5A
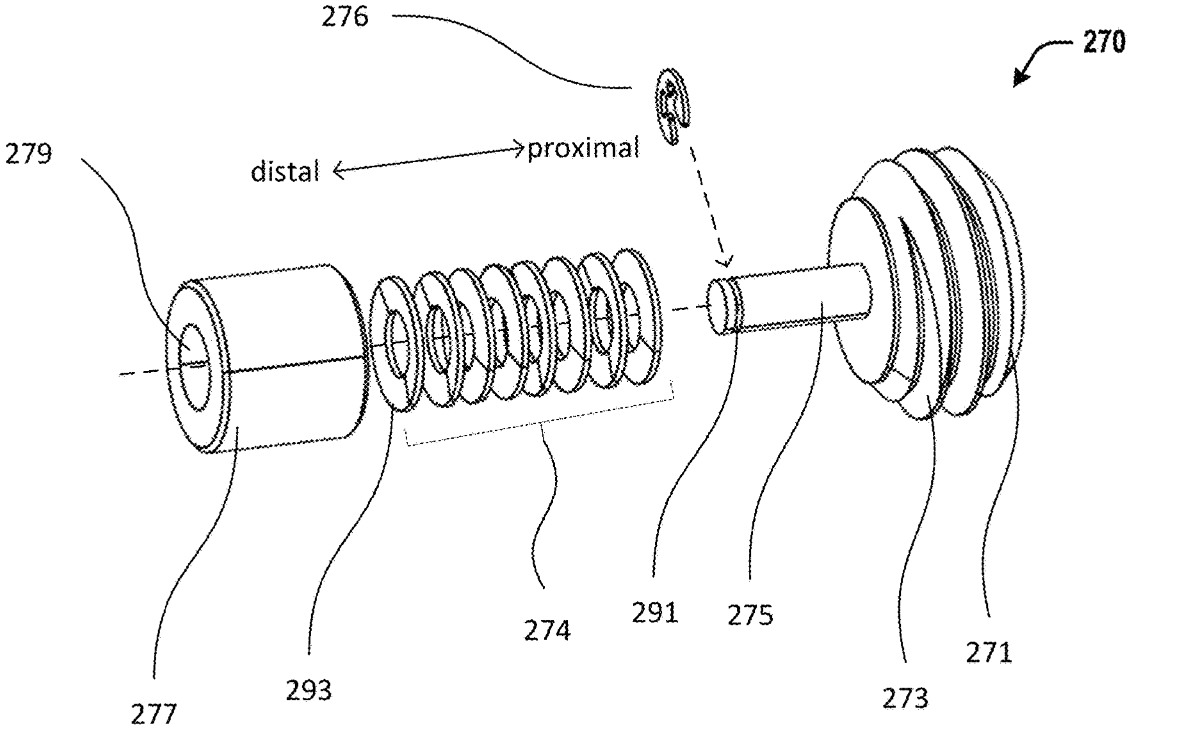
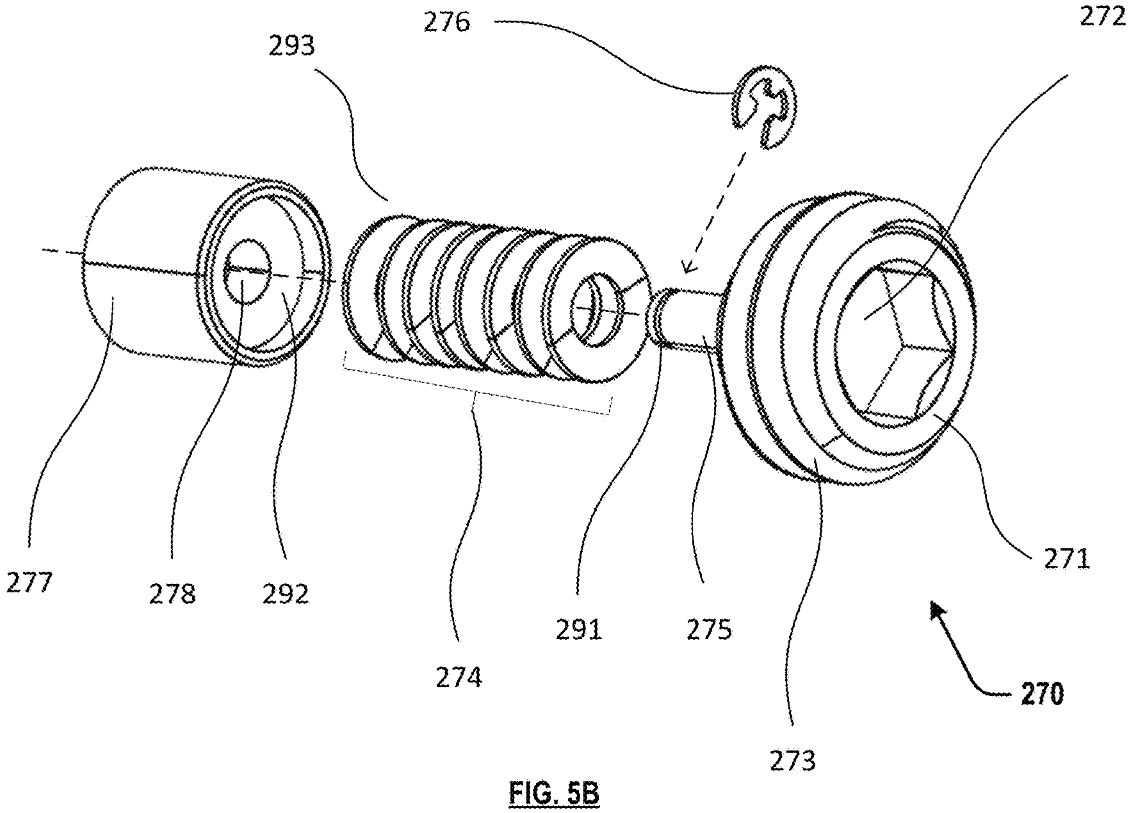
FIG. 5B

COMPENSATING SET SCREW FOR TERMINAL BLOCKS TO COMPENSATE FOR SETTLING OF MULTI-STRAND WIRE

INTRODUCTION

Large enterprise-grade computer systems can require a great amount of power. In particular, computer systems which comprise multiple compute units (e.g., "blades" or "trays") aggregated together, such as High Performance Compute (HPC) systems, may require thousands or tens-of-thousands of watts of power. Power is often delivered to these large systems and/or distributed within these systems by multi-strand power wires (a multi-strand wire comprises many smaller conductive strands which are bundled together to form a single conductor, as opposed to single-strand (or "solid") power wires in which each individual conductor comprises a single monolithic wire). For example, a computer system with multiple compute units may have a power distribution unit (PDU) which receives input power from an external power source (e.g., a utility) via a first set of conductors and distributes the power to the individual compute units in the system via a second set of conductors, with the first set and/or the second set of conductors comprising multi-strand wires. Often, the multi-strand wires may be hardwired to terminal blocks, as opposed to being removably connected via a plug or connector. For example, the multi-strand power lines may enter the PDU of a computer system and be terminated at a terminal block of the PDU, thereby electrically connecting the power wire to internal electrical circuitry in the PDU. In addition, there may be various similar terminal blocks within the PDU or elsewhere in the computing system to establish electrical connections to other wires which aid in distributing the power to the various components of the large computer systems.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings:

FIGS. 5A-B are exploded perspective views of the compensating set screw of FIG. 2. FIG. 5A shows the set screw from a bottom perspective. FIG. 5B shows the set screw from a top perspective.

FIG. 6A illustrates a first configuration in which the spring mechanism comprises a single spring. FIG. 6B illustrates a second configuration in which the spring mechanism comprises multiple springs arranged in series with the same orientations. FIG. 6C illustrates a third configuration in which the spring mechanism comprising multiple springs arranged with alternating orientations. FIG. 6D illustrates a fourth configuration in which the spring mechanism comprises multiple groups of springs, with each group having multiple springs with the same orientation as one another, and with the groups having alternating orientations relative to one another.

FIG. 7A illustrates the electrical termination in a first state in which the set screw is compressed. FIG. 7B illustrates the electrical termination in a second state in which the set screw is partially decompressed.

FIG. 8A illustrates the electrical termination in a first state in which the set screw is compressed. FIG. 8B illustrates the electrical termination in a second state in which the set screw is partially decompressed

DETAILED DESCRIPTION

Figure 1:
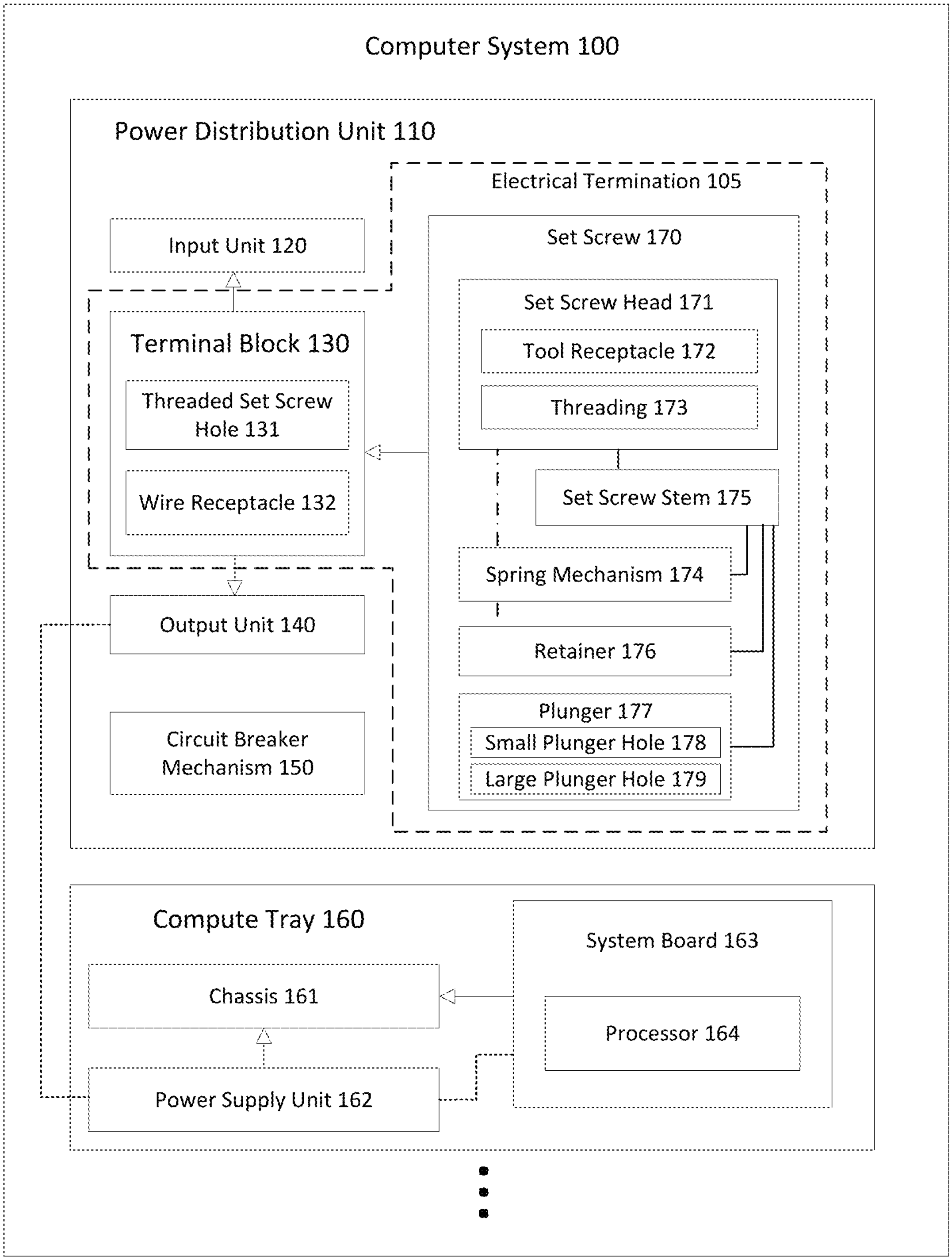
FIG. 1 is a block diagram illustrating an example computer system including an example electrical termination including a terminal block and compensating set screw.

As noted above, some computing systems (particularly large-scale computing systems) may include terminal blocks to terminate electrical wires which supply power to and/or distribute power within the system. At each terminal block, there are one or more set screws used to hold the power wires in place. Each wire is inserted into an opening in the terminal block, and a corresponding set screw is screwed into the terminal block and presses down on the power wire to hold it in place. When the wire terminated at the terminal block is a multi-strand wire, over time, the power wire may settle due to conditions such as heat fluctuations and vibration. This is especially prevalent in high strand count power wires often used in lager computing systems, as they tend to settle more than low strand count wires. High strand count wire is more flexible than lower strand count wire. As space in large-scale computing systems gets smaller, higher strand count wire becomes more likely to be used to distribute the power to and within the large-scale computing systems.

As the power wires settle, the contact pressure between the power wires and the set screw reduces and, in some cases, the wire may become loose in the terminal block. This causes the electrical resistance at the interface between the wire and the terminal block to increase. The increase in resistance leads to increased heat and can even cause fires. Adding a second set screw may sometimes help hold the power wire in place, but since the power wire is likely to settle under both set screws, it cannot solve the problem. Due to the risk of fires from this, maintenance tasks are required to re-torque the set screws in all of the terminal blocks. The process may require the PDU and other locations of the terminal blocks to be powered off during the maintenance. This can be very time-consuming and expensive for the operator of the computing system due to the required downtime. It also requires a design where the terminal blocks must be readily available to be re-torqued. This further restrains the design of the PDU and other locations.

To address these and other issues, examples disclosed herein include computing system terminal blocks which have compensating set screws that can maintain suitable contact pressure with multi-strand power wires as the power wires settle. These set screws each comprise a spring-loaded plunger which can move along a stem of the screw. When the set screw is initially tightened, a spring mechanism of the set screw is compressed, resulting in spring forces which press the plunger against the wire. Thus, as the wire settles, the spring mechanism causes the plunger to follow the wire and to continue to press against the wire. In this manner, high contact pressure can be maintained with the wire notwithstanding its settling, thus avoiding an increase in resistance due to loosening of the wires.

An example compensating set screw may include a threaded set screw head, a set screw stem, a set screw spring mechanism, a plunger and a plunger retainer. The set screw head may be configured with external threading surrounding the exterior and a tool receptacle on top of the set screw head where the appropriate tool can be used to tighten or loosen the set screw within the terminal block. The set screw stem is attached to the set screw head and extends below the set screw head. The spring mechanism is placed on the set screw stem below the set screw head. The plunger is moveably attached to the set screw stem below the spring mechanism. Below that, on the set screw stem is the retainer, which is configured to hold the plunger moveably attached to the set screw stem.

Because the spring mechanism is positioned between the head of the set screw and the plunger, the position of the plunger along the stem determines a state of compression of the spring mechanism—i.e., the closer the plunger is to the head, the more compressed the spring mechanism. For example, the spring mechanism becomes loaded (compressed) when the set screw is screwed into the terminal block, as the tightening of the screw and contact between the plunger and the wire cause the plunger to move along the stem to a retracted position (the retracted position being nearer to the head than an initial position of the plunger). The compression of the spring mechanism results in a restoring spring force pushing the plunger away from the head and against the power wire. The power wire is thus initially secured by the plunger in this retracted position. As the power wire settles, the spring mechanism urges the plunger of the set screw to follow the power wire and move along the set screw stem towards an extended position. In this extended position of the plunger, the spring mechanism continues to generate spring forces which push the plunger against the wires and maintain contact pressure on the power wire.

In some examples, the spring mechanism may include one or more disk springs. Belleville washers could be used, for example. A single disk spring could be used, or stacks of disk springs could provide even more pressure against the power wire. The stacks could be configured as a stack of parallel disk springs. They could also be configured in pairs of opposing disk springs. Since the disk springs are conical, when stacked in a pair in opposite directions, they provide more range of motion than would two disk springs stacked in parallel. This pair of opposing disk springs may be repeated to further increase the range of motion. These two configurations may be combined so that the spring mechanism consists of a stack of disk springs in parallel with each other stacked on top of a second stack of disk springs in parallel with each other where the two stacks are aligned in opposite directions. Stacks may also be formed of two or more disk springs in any pattern of upright and inverted disk springs. These different configurations of the spring mechanism allow for compensating set screws with many different configurations of force and range of motion. Other spring mechanisms are possible, including the use of one or more helical (spiral) compression springs.

Terminal blocks are typically rated to a set torque value that corresponds to a certain amount of clamping force. They need to be able to apply a set amount of clamping force initially as well as after the settling of the power wire. Having a highly configurable compensating set screw allows for maintaining sufficient force in many different situations with different types of power wire. This is important to ensure that sufficient clamping force is still applied after the power wire settles, regardless of the strand count of the wire being used.

Terminal blocks configured with these set screws may be deployed at multiple locations in the large computer system, and specifically in multiple parts of the power distribution unit (PDU) in some examples. The terminal block is configured with a threaded set screw hole for accepting the set screw by meshing with the threads of the set screw as the set screw is screwed into the terminal block. The terminal block also includes a wire receptacle for accepting the power wire. The terminal block is configured such that the set screw is screwed into the terminal block with an appropriate tool, pushing the plunger against the power wire in the wire receptacle such that the power wire is held in place.

In some examples, the terminal block of the PDU that first receives the power from a power source into the computing system is located at the input unit of the PDU. It is most likely to see high strand count wires and therefore most likely to experience the settling of the power wires. However, within the PDU, other terminal blocks can experience this problem and thus would benefit from terminal blocks configured with the disclosed set screw. For example, PDUs often include circuit breaker mechanisms, such as fuses, within the PDU itself. As the power is connected into and out of the circuit breaker mechanism it is often by way of a terminal block. Additionally, power connections coming out of the output unit of the PDU to be distributed to the individual compute trays and other components of the large computer system will go through terminal blocks.

In some computing systems, multiple compute trays are aggregated together, and each individual compute tray of the large computer system will typically include its own power supply unit (PSU). The PSU may be configured to convert AC power delivered from the PDU to DC power for use in the compute tray. The PSU may also be configured to convert one voltage level to another. The power exiting the PDU is distributed to the multiple compute trays where it is received by the PSUs. In some examples, one of the disclosed terminal blocks may be used at the PSU to receive the power from the PDU.

Each of the compute trays includes a chassis configured to hold the individual components of the compute tray, such as the PSU and system board. The system board includes one or more processors. The multiple compute trays are often included as part of a much larger computer system held in a rack system together with other components of the large computer system, such as the PDD, cooling infrastructure, networking systems, and storage systems.

These and other examples will be described in greater detail below in relation to FIGS. 1-9.

FIG. 1 illustrates an example electrical termination 105 and an example computer system 100 comprising the same. The electrical termination 105 is illustrated in an installed state in the computer system 100 to aid understanding, but in some examples the electrical termination 105 could be provided (e.g., manufactured, sold, etc.) separately from the other components of computer system 100. In addition, the electrical termination 105 is illustrated as a part of a power distribution unit (PDU) to aid understanding, but in various examples the electrical termination 105 could be provided elsewhere in the computing system 100, in addition to or in lieu of being provided as part of the PDU. In particular, the electrical termination 105 may be provided anywhere in the computing system 100 where it is desired to terminate a power wire.

The computer system 100 may comprise one or more Power Distribution Units (PDUs) 110 and one or more compute trays 160. While FIG. 1 only shows one of each, it should be understood that more than one PDU 110 and more than one compute tray 160 is possible within the computer system 100.

The compute tray 160 includes a chassis 161, power supply unit 162 and system board 163. The chassis 161 may be configured to hold the system board 163 and the power supply unit 162. The system board 163 may be configured to hold one or more processors 164. The power supply unit 162 is configured to receive power from the PDU 110 and provide it to the other components of the compute tray 160, such as the system board 163. The power supply unit 162 may include one or more terminal blocks 130.

The PDU 110 has an input unit 120 and an output unit 140. The input unit 120 is configured to receive power from an external power source, such as a utility power source, and may comprise electrical terminations to terminate (electrically connect to) external wires which carry the power from the external power source. The output unit 140 is configured to supply the power to the power supply units 162 of compute trays 160 and may comprise electrical terminations to electrically connect to wires or other conductors (e.g., bus bars) which connect the PDU 110 to the power supply units 162. In some examples, one or more of the electrical terminations of the input unit 120 and/or the output unit 140 comprises an electrical termination 105. The electrical terminations 105 each comprise a terminal block 130 and at least one compensating set screw 170.

In an example, the input unit 120 includes at least one electrical termination 105 comprising a terminal block 130 configured to terminate an external power wire from an external power source. Thus, in such examples, the terminal block 130 of input unit 120 is where the input power first enters the computing system 100. From the input unit 120, the power is transferred through internal circuitry (e.g., internal power wires, bus bars, or other conductors) to other components of the PDU 110. In some examples, one of the other components of the PDU 110 may be a circuit breaker mechanism 150. While only one circuit breaker mechanism 150 is shown, it should be understood that more than one may be present in the PDU 110. The circuit breaker mechanism 150 may be a fuse, for example. In some examples, the circuit breaker mechanism comprises one or more of the electrical termination 105 that terminate internal PDU power wires, such as internal power wires coming from the input unit 120 and/or internal power wires going to the output unit 140. Power coming out of the circuit breaker mechanism 150 may be routed to other components and is eventually routed to the output unit 140. As noted above, in some examples, the output unit 140 may include one or more electrical terminations 105 comprising terminal block 130. From the output unit 140, power is routed from the PDU 110 to other components of the computer system 100, such as the compute tray 160.

As noted above, each electrical termination comprises a terminal block 130. The terminal block 130 may be configured with one or more set screw holes 131 and corresponding wire receptacles 132 (e.g., at least one set screw hole 131 per wire receptacle). Typically, there will be one set screw hole 131 per wire receptacle 132 but it is possible to configure more than one set screw hole 131 to a wire receptacle 132. Each set screw hole 131 is threaded and configured to receive a set screw 170 by screwing the set screw 170 into the matching threads of the set screw hole 131. Thus, in some instances, each electrical termination 105 may comprise the same number of set screws 170 as there are set screw holes 131 in the terminal block 130. The set screw hole 131 extends through the terminal block 130 and intersects (joins) with the corresponding wire receptacle 132 in such a way that, when the set screw 170 is screwed into the terminal block 130, it extends into the wire receptacle 132 to press against the power wire, holding it in place.

The set screw 170 includes a set screw head 171 and a set screw stem 175. The set screw head 171 includes a tool receptacle 172 on one end where the appropriate tool can be used to tighten or loosen the set screw 170 within the terminal block 130. Around the outer edge of the set screw head 171 is configured with threading 173 to mate with the threading on the set screw hole 131 in order to screw the set screw 170 into the terminal block 130. The set screw stem 175 extends below the set screw head 171. In some examples, the set screw stem 175 is integrally connected to (i.e., formed as part of the same monolithic body as) the set screw head 171. In other examples, the set screw stem 175 is formed separately from the set screw head 171 and is later attached thereto, e.g., by mechanical fasteners (e.g., external threads on the stem 175 which mate with internal threads in a hole in a bottom side of the head 171), welding, or other fastening techniques.

Towards the distal end portion of the set screw stem 175, opposite the set screw head 171, is attached a retainer 176. The retainer 176 is configured to hold the plunger 177 moveably attached to the set screw stem 175 (i.e., the retainer 176 blocks the plunger 177 and prevents it from coming off the distal end of the stem 175). In some examples, the retainer 176 may include a retaining clip, retaining washer, or similar component capable of holding the plunger 177 on the set screw stem 175 and allowing the plunger 177 to move up and down along the set screw stem 175.

The plunger 177 is configured with an opening for the set screw stem 175. There is a small plunger hole 178 on the portion of the plunger 177 closest to the spring mechanism 174 and a large plunger hole 179 on the opposite portion of the plunger 177. The small plunger hole 178 is smaller than the size of the retainer 176. The large plunger hole 179 is larger than the size of the retainer 176. This configuration allows the plunger 177 to move up and down along the set screw stem 175 while the small plunger hole 178 prevents the retainer 176 from passing through thus holding the plunger 177 moveably attached to the set screw stem 175.

In some examples, the retainer 176 is formed separately from the stem 175 and is later attached to the stem 175. For example, the retainer 176 may be removably attached to the stem, such as by a snap-fit or friction fit, or may be permanently attached to the stem 175, such as by welding. In other examples, the retainer 176 is integrally connected to (formed as part of the same monolithic body as) the stem 175. For example, the retainer 176 may be formed from a portion of the stem 175 which has been bent, deformed (e.g., like a rivet), or otherwise shaped so as to prevent the plunger 177 from passing of the distal end of the stem 175.

In some examples, the retainer 176 is attached to or formed in the stem 175 after the spring mechanism 174 and plunger 177 have been assembled onto the stem 175. This approach may be particularly useful in those examples in which the stem 175 is formed integrally with the set screw head 171, as it may allow for the spring mechanism 174 and plunger 177 to be assembled onto the stem 175 by passing them over a distal end of the stem 175 prior to attachment or formation of the retainer 176. In other examples, the retainer 176 is attached to or formed in the stem 175 prior to the spring mechanism 174 and plunger 177 being assembled onto the stem 175. This approach may be usable when the stem 175 is formed separately from the head 171, as this may allow the spring mechanism 174 and plunger 177 to pass over the proximal end of the stem 175 prior to the stem 175 being attached to the head 171.

Situated between the set screw head 171 and the plunger 177, along the set screw stem 175 is the spring mechanism 174. The spring mechanism 174 includes one or more springs. In one example, the springs may be disk springs. In other examples, the springs may be helical (spiral) compression springs.

In examples in which the springs are disk springs, each disk spring may have an outer edge, a central opening, and an inner edge defining the central opening. Moreover, in a resting (uncompressed) state, the inner edge is offset from the outer edge along an axis for the central opening. In other words, rather than being flat disks, the disk springs have the shape of a truncated hollow cone with a central bore, such that the inner edge protrudes above or below the outer edge. In these examples, the spring mechanism 174 can include many different configurations of disk springs. In one configuration, there is a single disk spring. In a second configuration, there are two or more disk springs stacked in series, with all of the disk springs having the same orientation. (Note that, as used herein, the orientation of the disk springs is defined by the direction that the inner edge thereof protruded relative to the outer edge; for example, in a first orientation the inner edge protrudes upward and in a second orientation the inner edge protrudes downward.) In a third configuration, one or more pairs of disk springs are stacked, where each pair consists of two adjacent disk springs having opposite orientations, i.e., stacked in opposite directions from each other. In other words, the disk springs alternate in their orientations. In a fourth configuration, one more sets of disk springs are provided stacked, with each set of disk springs comprising two sub-sets: a first subset with two or more disk springs stacked in series and having the same orientation as one another, and a second subset, stacked on the first subset, and comprising two or more disk springs stacked in series and having the same orientation as one another but a different orientation than the first subset. For example, each set could comprise four disk springs with a first subset of two disk springs with a first orientation stacked on a second set of two more disk springs having a second orientation. The spring mechanism 174 may consist of any number of disk springs stacked in any configuration of upright and opposite configurations.

The set screw 170 is configured such that when it is screwed into the terminal block 130 at the set screw hole 131, it presses on the power wire holding it in place within the wire receptacle 132. As the set screw 170 is tightened into place against the power wire, the spring mechanism 174 is compressed. Should the power wire settle, the compressed spring mechanism 174 expands pushing the plunger 177 down along the set screw stem 175 and against the power wire maintaining pressure against the power wire. This pressure aids in holding the power wire in place within the wire receptacle 132 and also in maintaining a proper electrical contact between the set screw 170 and the power wire.

Computer system 100 may further include many components not specifically shown in FIG. 1 including storage and memory components, and networking components, for example.

Turning now to FIGS. 2-5B, an example set screw 270 will be described. Reference will also be made to FIGS. 6A-7B on occasion. The set screw 270 is one example implementation of the set screw 170 described above. Thus, set screw 270 comprises some components which correspond to (i.e., are implementations of) components of the set screw 170. These corresponding components are assigned similar reference numbers having the same last two digits, such as 177 and 277. Descriptions of the components of the set screw 170 above may apply to the corresponding components of the set screw 270. Although set screw 270 is one example implementation of set screw 170, set screw 170 is not limited to set screw 270.

Figure 2:
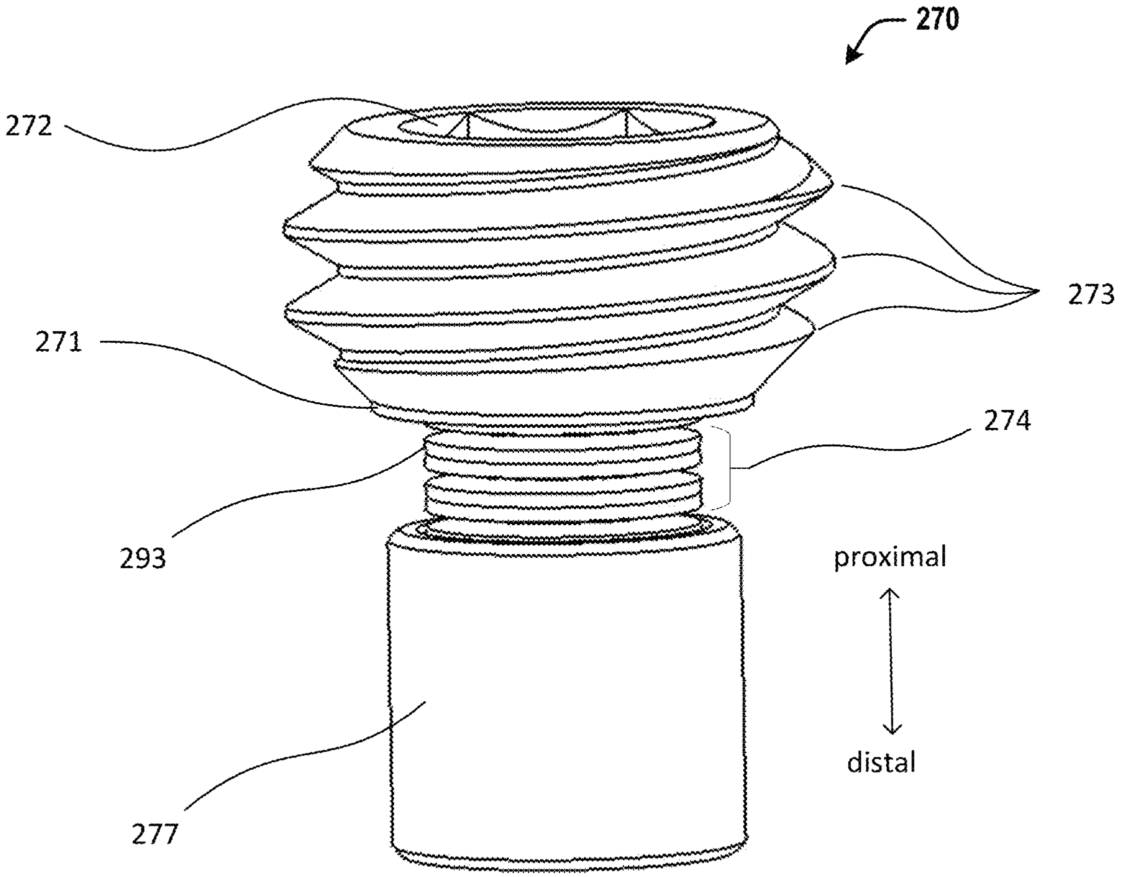
FIG. 2 is perspective view of an example compensating set screw.
Figure 3:
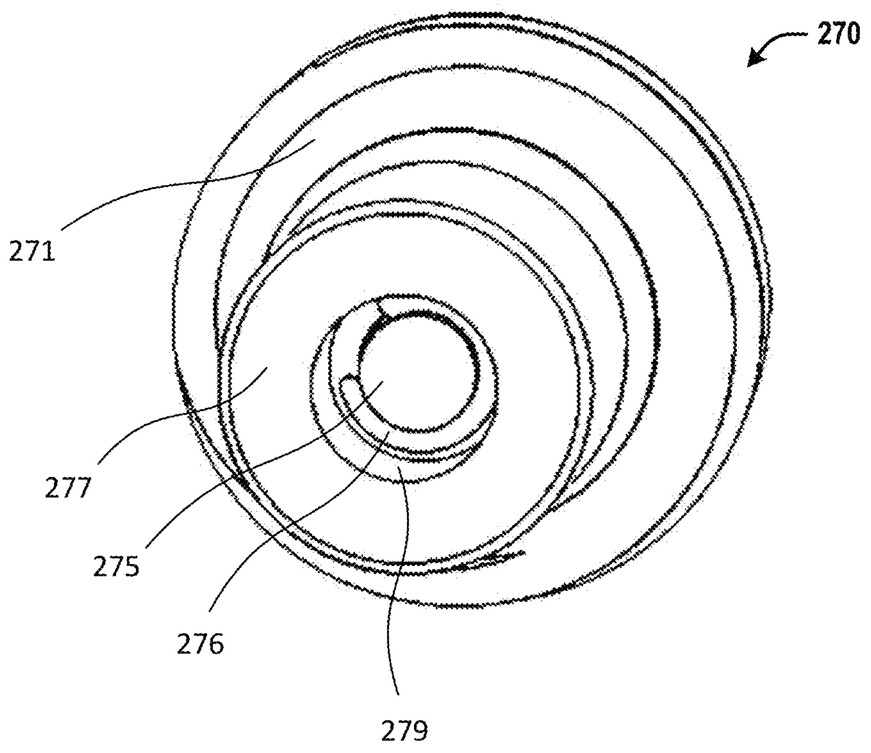
FIG. 3 is another perspective view of the compensating set screw of FIG. 2.
Figure 4:
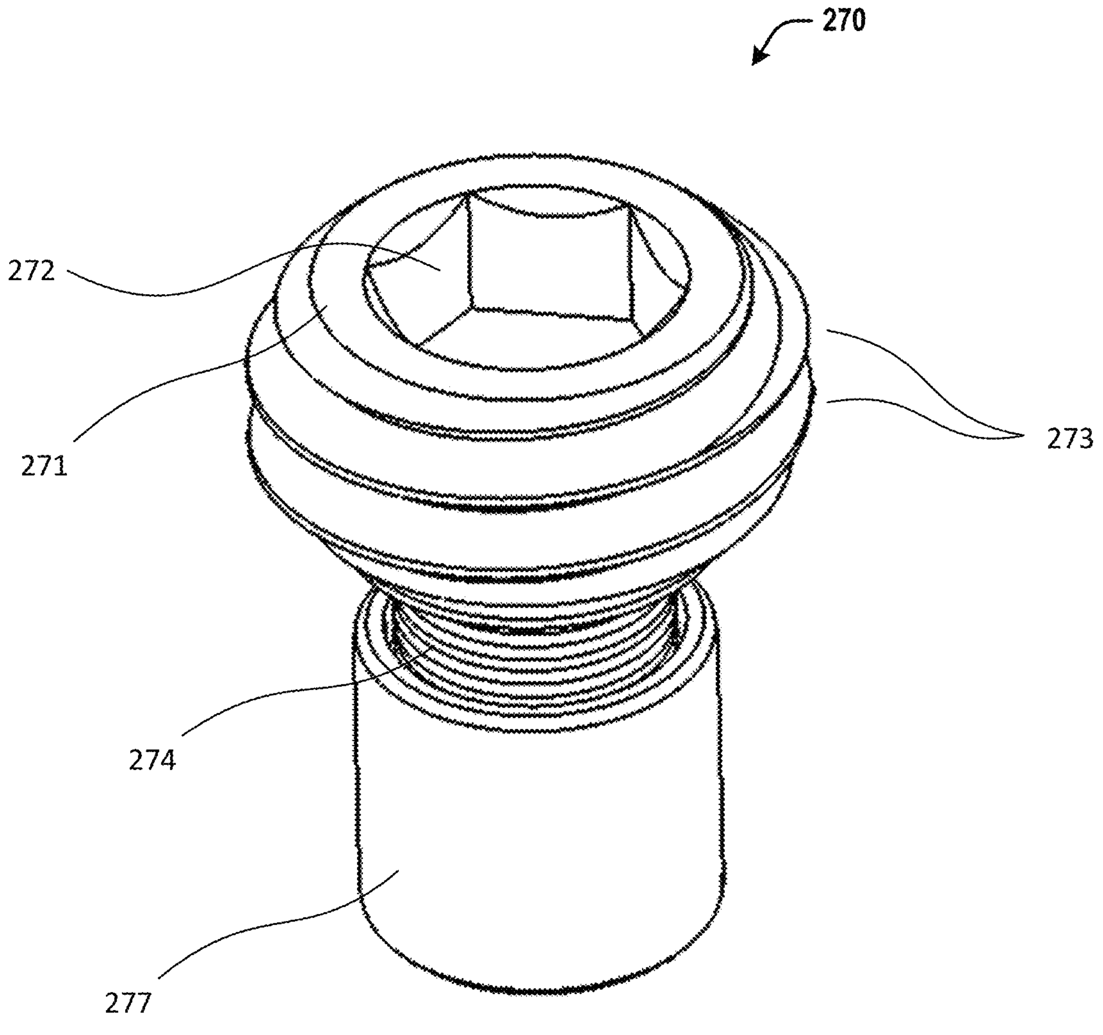
FIG. 4 is another perspective view of the compensating set screw of FIG. 2.

FIGS. 2-4 show different perspectives of example set screw 270, while FIGS. 5A-B show exploded views of the set screw. As shown in FIGS. 2 and 4, the set screw includes a set screw head 271, a spring mechanism 274, and a plunger 277. The set screw head 271 includes both the tool receptacle 272 and threading 273. The tool receptacle 272 is where an appropriate tool may be used to tighten and loosen the set screw 270 within the terminal block. In the illustrated example, the tool receptacle 272 has a hexagonal profile to receive a hex wrench, but any other shape of tool receptacle could be used instead, such as a Philips screw drive receptacle, flat-head screw driver receptacle, a square driver receptacle, a Torx driver receptacle, etc. The threading 273 is external threading which meshes with the internal threading of the terminal block as the set screw 270 is screwed into the terminal block. From the side-on perspective shown in FIG. 2, below the set screw head 271 is the spring mechanism 274 and below that is the plunger 277.

Figure 7A:
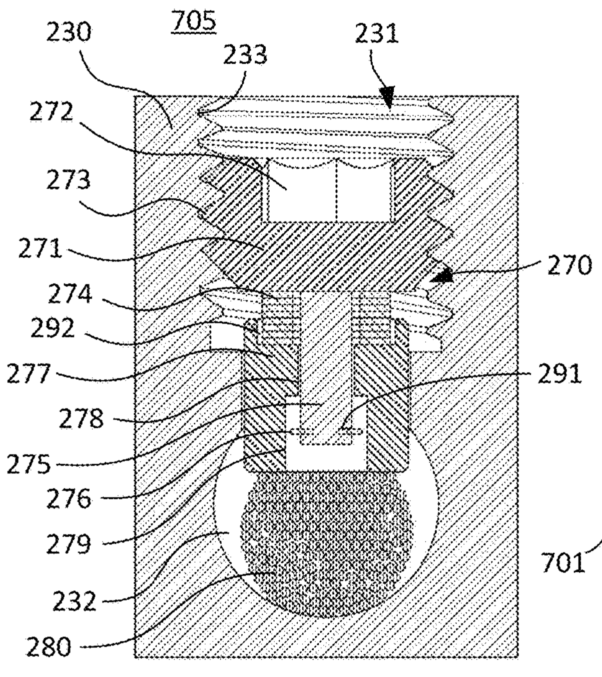
FIGS. 7A-B are cross-sectional views of an example electrical termination comprising a terminal block and the compensating set screw of FIG. 2.

As shown in FIGS. 5A and 5B, the set screw 270 also comprises a set screw stem 275 and a retainer 276. The stem 275 extends distally from a bottom side of the set screw head 271. As shown in FIGS. 3, 5A and 5B (see also FIGS. 7A and 7B, described below), the retainer 276 is attached to a distal end portion of the stem 275 and the spring mechanism 274 and the plunger 277 are disposed on the stem 275 between the retainer 276 and the head 271. As shown in FIGS. 3, 5A, 5B, and 7A, the plunger 277 comprises a large plunger hole 279 that fits (has a larger diameter than) the retainer 276 and a smaller hole that fits (has a larger diameter than) the stem 275. The larger hole 279 and smaller hole 278 are coaxial and connected to one another, with the smaller hole 278 being proximal of the larger hole 279 (i.e., the smaller hole 278 is closer than the larger hole 279 to the screw head 271). The stem 275 extends through the smaller hole 278 into the lager hole 279. As shown in FIGS. 3 and 7A, the retainer 276 is positioned within the hole 279 and can move within the hole 279 as the plunger 277 moves along the stem 275. The smaller hole 278 has a diameter smaller than the retainer 267 such that the retainer 276 cannot be drawn through the hole 278. In other words, the retainer 276 abuts a portion of the plunger 277 which forms a distal rim of the smaller hole 278, which prevents the plunger 277 from moving distally past the retainer 276, thus retaining the plunger 277 on the stem 275. In this example, the retainer 276 is a clip which is removable attached to the stem 275 by engagement with a retainer holder 291 in the distal end portion of the stem 275, as shown in FIG. 5A. The retainer holder 291 may comprise a groove encircling the stem 275 and the retainer 267 may be snap-fitted into the groove to attach ether retainer 276 to the stem 275.

As shown in FIGS. 5A and 7A, in some examples, the plunger 277 has a recess 292 at a proximal end thereof, i.e., the end where the plunger 277 meets the spring mechanism 274. The spring mechanism 277 may fit within the recess 292. In other examples, the recess 292 may be omitted (see FIGS. 8A and 8B, described below).

As shown in FIGS. 2, 5A, 5B, and 7B, in this example, the spring mechanism 274 comprises multiple conical disk springs 293. Specifically, in the illustrated example, eight disk springs 293 are arranged in the third configuration described above, i.e., in four pairs of springs, with each pair having two springs 293 with opposite orientations. However, any other configuration of the springs 293 could be used, and any other number of springs 293 could be used. For example, FIGS. 6A-6D illustrate some examples of configurations of spring mechanisms using conical disk springs which could be used to form the spring mechanism 274.

Figure 6A:
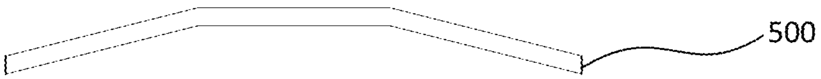
FIGS. 6A-6D comprise schematic diagrams illustrating example configurations of spring mechanisms of a compensating set screw.
Figure 6B:
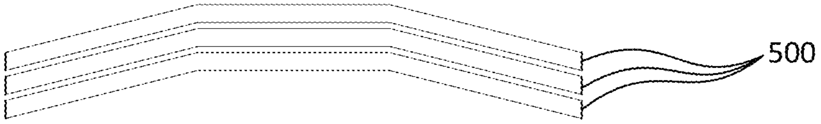
Figure 6C:
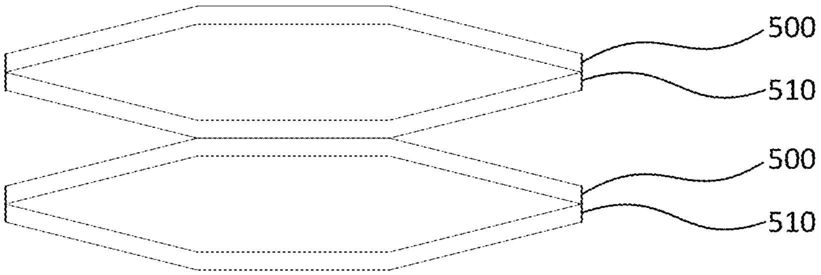
Figure 6D:
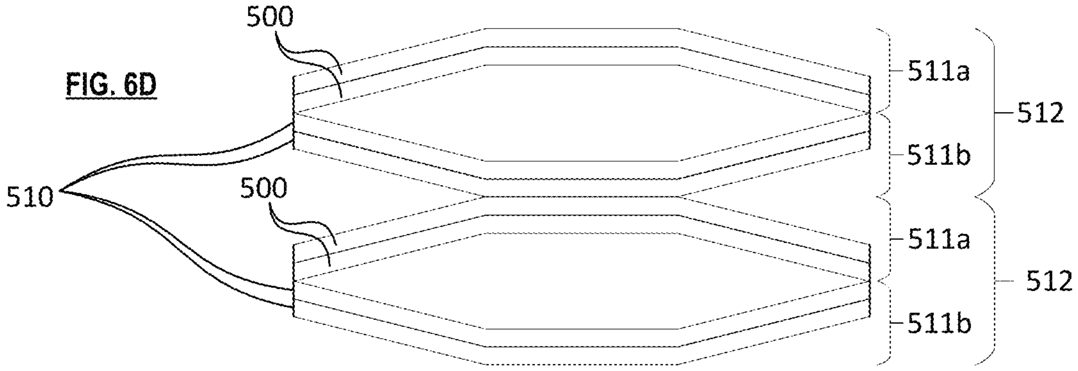

FIG. 6A illustrates an example configuration in which a single upright disk spring 500 is used. FIG. 6B illustrates another configuration in which multiple upright disk springs 500 may be stacked in series. This is one example of the second configuration described above. While three upright disk springs 500 are shown, it should be understood that any number of upright disk springs 500 are possible. In a series configuration such as in FIG. 6B, the spring forces of the disk springs 500 are added together such that a given amount of compression of the entire stack produces a total spring force which is multiplied relative to the spring force generated by compressing a single spring the same amount. Specifically, if a given disk spring 500 generates a spring force of X when compressed a given distance D, compression of the entire stack by that same amount D will generate a spring force of N*X, where N is the number of disk springs 500.

FIG. 5C illustrates an example of the spring mechanism configured with pairs of disk springs, each comprising two springs 500 and 510 oriented in opposite directions. This is an example of the third configuration described above. Upright disk springs 500 are shown upright and each one is paired with an inverted disk spring 510. Two such stacked pairs are illustrated, but in practice any number of pairs could be included. In such a configuration, the range of motion for the entire stack is extended as compared to if the same number of springs were provided in a series configuration. For example, if a single disk spring has a range of motion of D, then in the second configuration the range of motion of the entire stack is D whereas range of motion of the entire stack in the third configuration may be D*N, where N is the number of disks.

FIG. 5D shows another example configuration of the spring mechanism where multiple sets 512 of springs are stacked, with each set 512 of springs comprising two subsets 511: a first subset 511*a* comprising two upright disk springs 500 in series stacked on a second subset 511*b* comprising two inverted disk springs 510 in series. This pattern is shown repeated twice in FIG. 5D (i.e., two stacked sets 512), but it may be repeated many times with more sets 512. Moreover, while only two disks 500 or 510 are shown per subset 511, in practice each subset 511 could have more than two disks. This configuration may multiply the amount of spring force generated for a given amount of compression as compared to a single disk spring. Specifically, if M is the number of springs per subset and X is the spring force generated by compressing a single spring by a given distance D, then compressing the entire stack by the given distance D will produce a spring force of M*D. Moreover, this configuration may multiply the range of motion of the stack as compared to a purely series stack. For example, if a single disk spring has a range of motion of D, then the range of motion of the entire stack may be Y*D, where Y is the number of subsets 511 included in the stack.

While these four specific examples are illustrated in FIGS. 6A-6D, it should be understood that any number of disk springs in any pattern of upright and inverted configurations may be used.

Turning now to FIGS. 7A-8B, example electrical terminations 705 and 805 will be described. These electrical terminations 705 and 805 are example implementations of the electrical termination 105 described above. Electrical termination 705 comprises an instance of the set screw 270 described above, together with a terminal block 230. Electrical termination 805 comprises a set screw 370, together with the terminal block 230. The set screw 870 is a variation of the set screw 270 and is identical thereto except that set screw 870 includes a plunger 877 in lieu of the plunger 277, as will be described below. Components of the set screw 870 which are identical to those of the set screw 270 are given the same reference numbers, and duplicative descriptions thereof are omitted below.

Figure 7B:
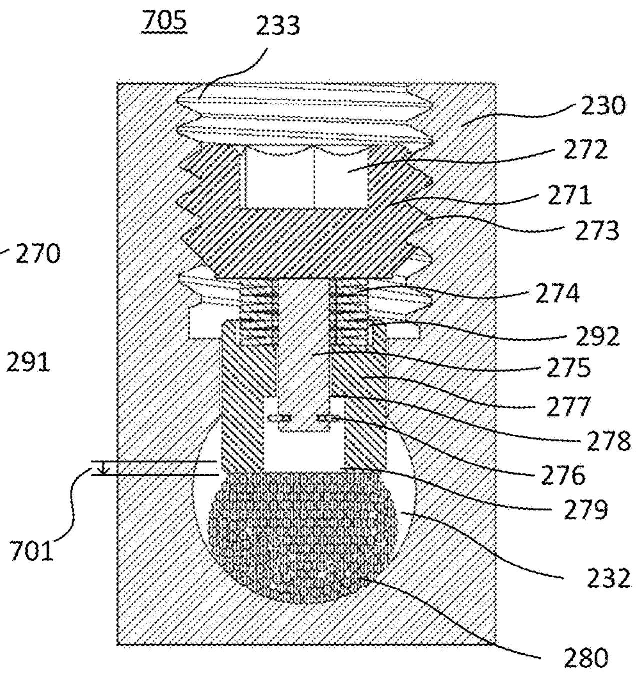

FIGS. 7A-B show an example terminal block 230 and set screw 270 in a cross-section view. Terminal block 230 comprises a set screw hole 231 configured to receive the set screw 270. The set screw hole 231 comprises internal terminal block threading 233 on a radially inward surface of the set screw hole 231 configured to mate with the external threading 273 of the set screw 270. FIGS. 7A and 7B show the set screw head 271 screwed into the terminal block 230 where the threading 273 of the set screw head 271 has been mated with the terminal block threading 233.

The terminal block 230 also comprises a wire receptacle 232 configured to receive a wire such as multistrand wire 280. The set screw hole 231 extends along an axis which is transverse to an axis of the wire receptacle 232, and screw hole 231 intersects with wire receptacle 232. Thus, when set screw 270 is screwed into terminal block 230, as in FIGS. 7A and 7B, a portion of set screw 270 is retained in set screw hole 231 (e.g., the head 271) and a portion of set screw 270 protrudes out of set screw hole 231 into wire receptacle 232. Specifically, when wire 280 is in receptacle 232 and set screw 270 is installed in the set screw hole 231 and appropriately tightened down, the plunger 277 of the set screw 270 will protrude into the wire receptacle 232 and contact the wire 280, as shown in FIG. 7A.

In FIG. 7A, the set screw 270 is shown in a compressed state. In this state, plunger 277 is at a retracted position which is closer to the screw head 271 than a resting position of the plunger 277. (In the resting position, the plunger 277 is located as far distally along the stem 275 as possible, i.e., at the position where the rim around the smaller hole 278 of plunger 277 abuts the retainer 276). With the plunger 277 in this retracted position, the spring mechanism 274 is in a loaded state where the disk springs are compressed, as shown in FIG. 7A.

The compressed state of the set screw 270 as shown in FIG. 7A may be attained, for example, in response to the set screw 270 being screwed into the terminal block 230 while the wire 280 is present. In other words, FIG. 7A depicts a state of the electrical termination 705 immediately after the set screw 270 is initially installed to hold the wire 280. As the set screw 270 is screwed into the terminal block 230, the plunger 277 eventually contacts the wire 280. Continued tightening of the set screw 270 thereafter results in the set screw head 271 and stem 275 moving distally (downward in FIG. 7A) while the plunger 277 is held stationary by the wire 280, resulting in the distance between plunger 277 and head 271 decreasing. In other words, plunger 277 moves relative to the stem 275 towards the head 271. This results in the compression of the spring mechanism 274. If tightening is continued, eventually the plunger 277 reaches the retracted position shown in FIG. 7A, with the spring mechanism 274 being fully compressed.

FIG. 7B shows the electrical termination 705 in a partially decompressed state. In this state, the plunger 277 is located at a position along the stem 275 which is part way between the fully retracted position shown in FIG. 7A and the resting, fully distal, position described above. This state may occur, for example, sometime after the state shown in FIG. 7A as a result of the wire 280 having settled. When the wire 280 settles, the spring forces generated by the spring mechanism 274, which push the plunger 277 in the distal (downward) direction, cause the plunger 277 to follow the wire 280. Thus, to reach the state of FIG. 7B, the plunger 277 will have moved distally (downward) a distance 701 relative to the retracted position of FIG. 7A. As a result of this movement, the plunger 277 is now farther from the set screw head 271, and therefore the spring mechanism 274 is partially decompressed. However, the spring mechanism 274 remains partially compressed and thus continues to generate spring forces which push the plunger 277 against the wire 280, thus maintaining the needed contact pressure to ensure a good electrical connection. This state of the spring mechanism 274 may also be referred to as a partially unloaded state. The distance 701 shows where the plunger 277 has moved further into the wire receptacle 232 pushed by the spring mechanism 274 as the wire 280 has settled. Settling of the wire 280 may happen over time and may be caused by fluctuations in heat and vibration.

Figure 8A:
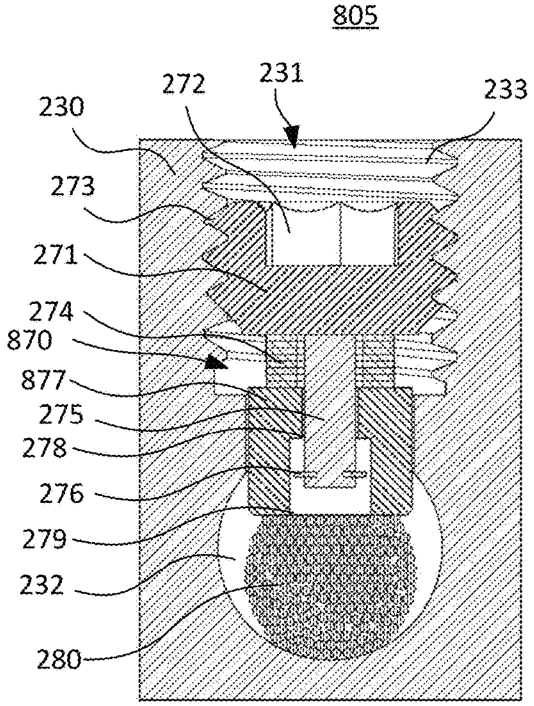
FIGS. 8A-B are cross-sectional views of an example electrical termination comprising a terminal block and an example set screw.
Figure 8B:
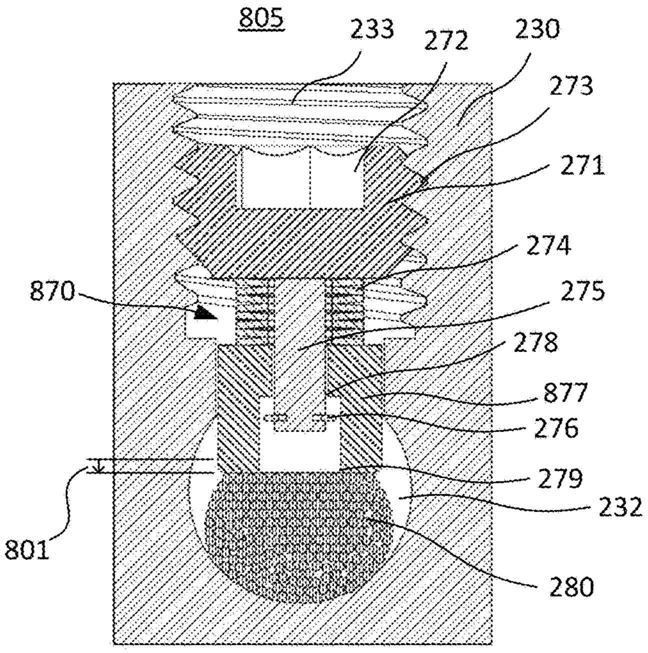

As shown in FIGS. 8A-B, the electrical termination 805 is similar to the electrical termination 705 described above. In particular, electrical termination 805 comprises the same terminal block 230 described above. Moreover, electrical termination 805 comprises a set screw 870 which is identical to the set screw 270 except that the set screw 870 comprises the plunger 877 instead of the plunger 277. The plunger 877 is similar to the plunger 277 except that the plunger 877 does not have the recess 292 at the proximal end thereof. Instead, the proximal end of the plunger 877 is flat. FIG. 8A illustrates the electrical termination 805 in the compressed state, which is similar to the compressed state of the electrical termination 705 described above and illustrated in FIG. 7A. FIG. 8B illustrates the electrical termination 805 in the partially compressed state, which is similar to the partially decompressed state of the electrical termination 705 described above and illustrated in FIG. 7B. In transitioning between these states, the plunger 877 moves distally (downward) by a distance 801, as shown in FIG. 8B.

Figure 9:
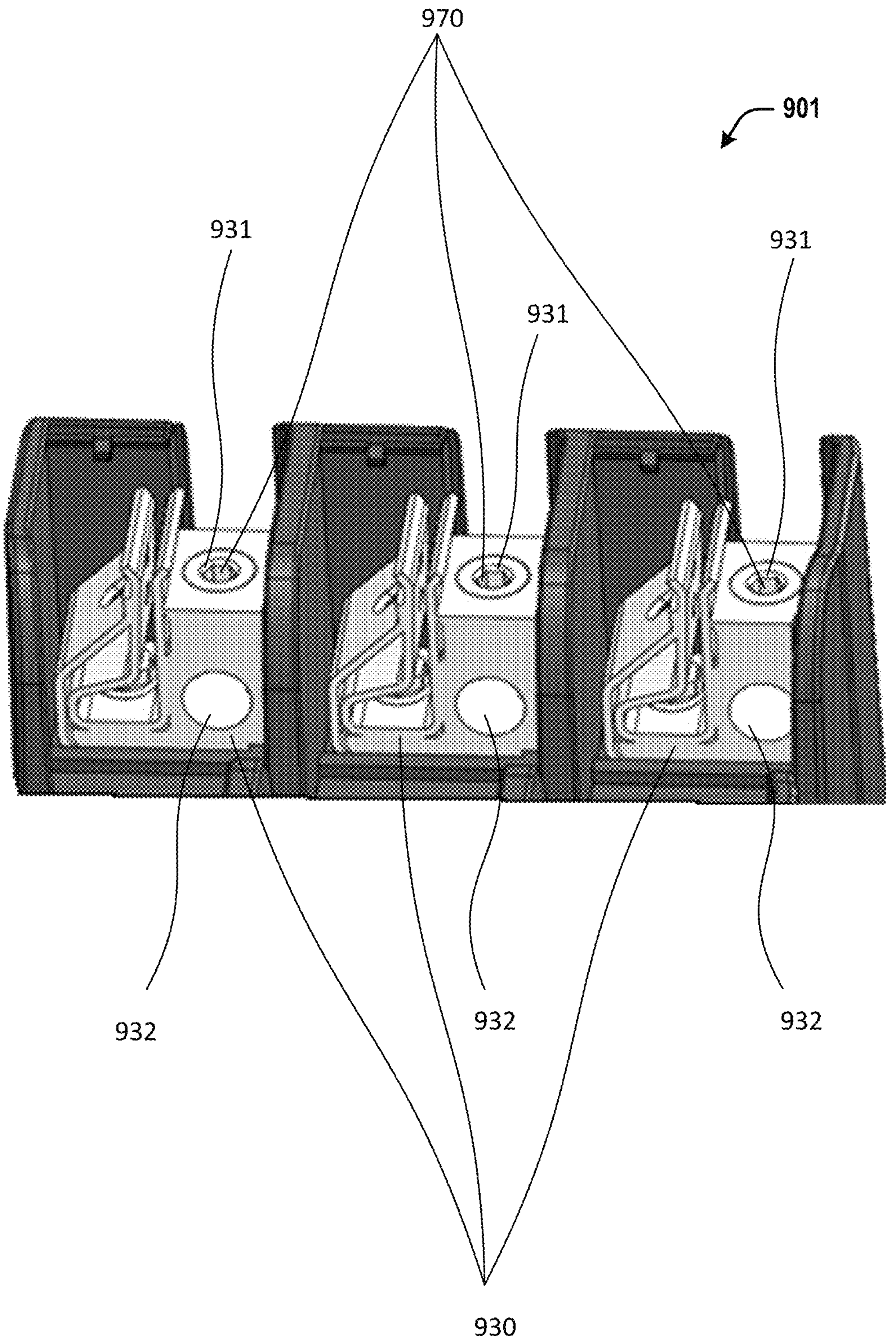
FIG. 9 is a perspective view of an example terminal block unit.

FIG. 9 shows an example terminal block unit 901. This example shows three electrical terminations, each comprising a terminal block 930 and a corresponding set screw 970. Each terminal block 930 comprises a set screw hole 931 and wire receptacle 932. It should be understood that while this example terminal block unit 901 shows three terminal blocks 930, any number could be used. Additionally, it is not required that there be an equal number of set screw holes 931 and wire receptacles 932. For example, a terminal block could be configured where multiple set screws holes 931 are configured for a single wire receptacle 932. Also shown in FIG. 9 are three set screws 970, each one screwed into a set screw hole 931.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A device, comprising:

a terminal block comprising a set screw hole and a wire receptacle;

a set screw, comprising:

a set screw head configured to be received in the set screw hole, comprising:

a tool receptacle;

external threading around the outside of the set screw head configured to engage internal threading in the set screw hole;

a set screw stem attached at a first end portion to the bottom of the set screw head;

a plunger movably coupled to the set screw stem and movable along the set screw stem between an extended position and a retracted position;

a retainer, connected at a second end portion of the set screw stem and configured to retain the plunger on the set screw stem;

a spring mechanism, comprising one or more springs on the set screw stem between the set screw head and the plunger and configured to urge the plunger toward the extended position;

wherein the wire receptacle is configured to receive a power wire, wherein in a state of the power wire received in the wire receptacle and the set screw installed in the set screw hole:

the plunger extends into the wire receptacle and contacts the power wire; and the spring mechanism is compressed such that the spring mechanism urges the plunger against the power wire.

2. The device of claim 1, wherein the spring mechanism comprises a conical disk spring.

3. The device of claim 1, wherein the spring mechanism comprises a plurality of conical disk springs stacked in parallel.

4. The device of claim 1, wherein the spring mechanism comprises one or more pairs of conical disk springs stacked wherein each pair comprises two conical disk springs stacked in opposite directions from each other.

5. The device of claim 1, wherein upon completion of installation of the set screw, the plunger is located in a first position, and in response to the power wire experiencing settling subsequent to installation of the set screw, the spring mechanism causes the plunger to move to a second position and to maintain a predetermined contact pressure with the power wire, wherein the first position is closer to the retracted position than is the second position.

6. The device of claim 1, wherein the terminal block further comprises one or more additional set screw holes and wire receptacles.

7. The device of claim 1, wherein the end of the plunger that meets the spring mechanism comprises one of the following: a flat end and a recessed end.

8. A computing system, comprising:

one or more compute trays each comprising a chassis, a system board supported by the chassis, and a processor mounted to the system board;

a power distribution unit comprising:

an input unit configured to receive power;

an output unit configured to distribute the power to the compute trays;

one or more terminal blocks configured to receive a power wire at a wire receptacle and connect the power wire to the power distribution unit, wherein in a state of the power wire connected to the power distribution unit, the power wire is configured to convey the power to or through the power distribution unit, and wherein the one or more terminal blocks comprises a set screw, the set screw, comprising:

a set screw head, comprising:

a tool receptacle;

external threading around the outside of the set screw head configured to engage internal threading in the terminal block;

a set screw stem attached at a first end portion to the bottom of the set screw head;

a plunger movably coupled to the set screw stem and movable along the set screw stem between an extended position and a retracted position;

a retainer, connected at a second end portion of the set screw stem and configured to retain the plunger on the set screw stem;

a spring mechanism, comprising one or more springs on the set screw stem between the set screw head and the plunger and configured to urge the plunger toward the extended position;

wherein in a state of the power wire received in the wire receptacle and the set screw installed in the set screw hole:

the plunger extends into the wire receptacle and contacts the power wire; and the spring mechanism is compressed such that the spring mechanism urges the plunger against the power wire.

9. The computing system of claim 8, wherein the spring mechanism comprises a conical disk spring.

10. The computing system of claim 8, wherein the spring mechanism comprises a plurality of conical disk springs stacked in parallel.

11. The computing system of claim 8, wherein the spring mechanism comprises one or more pairs of conical disk springs stacked wherein each pair comprises two conical disk springs stacked in opposite directions from each other.

12. The computing system of claim 8, wherein upon completion of installation of the set screw, the plunger is located in a first position, and in response to the power wire experiencing settling subsequent to installation of the set screw, the spring mechanism causes the plunger to move to a second position and to maintain a predetermined contact pressure with the power wire, wherein the first position is closer to the retracted position than is the second position.

13. The computing system of claim 8, wherein the one or more terminal blocks further comprise one or more additional set screw holes and wire receptacles.

14. The computing system of claim 8, wherein the power distribution unit comprises one or more circuit breaker mechanisms, and wherein the one or more circuit breaker mechanisms comprise one or more terminal blocks.

15. The computing system of claim 8, wherein the input unit comprises one or more terminal blocks.

16. The computing system of claim 8, wherein the power distribution unit comprises one or more terminal blocks disposed between the input unit and the output unit.

17. The computing system of claim 8, wherein the one or more compute trays are housed in a rack system.

18. The computing system of claim 8, wherein the one or more compute trays comprise a power supply unit configured to accept power from the output unit of the power distribution unit and distribute it to components of the compute tray.

19. The computing system of claim 18, wherein the power supply unit comprises one or more terminal blocks.

20. The computing system of claim 8, wherein the end of the plunger that meets the spring mechanism comprises one of the following: a flat end and a recessed end.

* * * * *